US012359587B2

(12) United States Patent
Smith

(10) Patent No.: US 12,359,587 B2
(45) Date of Patent: Jul. 15, 2025

(54) GAS TURBINE ENGINE POWER CABLE COOLING

(71) Applicant: Rolls-Royce North American Technologies, Inc., Indianapolis, IN (US)

(72) Inventor: Alan W. Smith, Indianapolis, IN (US)

(73) Assignee: Rolls-Royce North American Technologies, Inc., Indianapolis, IN (US)

( * ) Notice: Subject to any disclaimer, the term of this patent is extended or adjusted under 35 U.S.C. 154(b) by 0 days.

(21) Appl. No.: 18/465,658

(22) Filed: Sep. 12, 2023

(65) Prior Publication Data
US 2025/0084769 A1   Mar. 13, 2025

(51) Int. Cl.
| | | |
|---|---|---|
| F01D 15/10 | (2006.01) |
| F01D 9/06 | (2006.01) |
| F02C 7/12 | (2006.01) |
| F02C 7/32 | (2006.01) |
| H01B 7/42 | (2006.01) |
| H02K 7/18 | (2006.01) |
| H05K 9/00 | (2006.01) |
| F01D 25/12 | (2006.01) |
| F02C 6/00 | (2006.01) |
| F02C 7/20 | (2006.01) |
| H01B 9/00 | (2006.01) |

(52) U.S. Cl.
CPC ............ *F01D 15/10* (2013.01); *F01D 9/065* (2013.01); *F02C 7/12* (2013.01); *F02C 7/32* (2013.01); *H01B 7/423* (2013.01); *H02K 7/1823* (2013.01); *H05K 9/0098* (2013.01); *F01D 25/12* (2013.01); *F02C 6/00* (2013.01); *F02C 7/20* (2013.01); *H01B 9/00* (2013.01)

(58) Field of Classification Search
CPC .......... F01D 15/10; F01D 9/065; F01D 25/12; F02C 7/12; F02C 7/32; F02C 6/00; F02C 7/20; H01B 7/423; H01B 9/00; H02K 7/1823; H05K 9/0098
See application file for complete search history.

(56) References Cited

U.S. PATENT DOCUMENTS

| | | | |
|---|---|---|---|
| 5,174,110 A * | 12/1992 | Duesler | F02C 7/32 244/129.1 |
| 6,030,176 A * | 2/2000 | Oeynhausen | F01D 25/162 415/214.1 |
| 7,040,097 B2 | 5/2006 | Mukherjee | |
| 9,611,756 B2 | 4/2017 | Biyani et al. | |

(Continued)

FOREIGN PATENT DOCUMENTS

| | | |
|---|---|---|
| CN | 109723558 B | 7/2022 |
| EP | 2834498 B1 | 5/2019 |

*Primary Examiner* — Gerald L Sung
*Assistant Examiner* — Rene D Ford
(74) *Attorney, Agent, or Firm* — Shumaker & Sieffert, P.A.

(57) ABSTRACT

An example propulsion engine includes at least one radial support structure (RSS) radially disposed about an engine centerline. A power cable is at least partially contained within a cavity of a first RSS or a cavity fluidically coupled to the cavity of the first RSS. The first RSS defines at least one cooling aperture fluidically coupling the cavity of the first RSS to an exterior surface of the first RSS. The at least one cooling aperture is configured to allow cooling fluid to flow into or out of the cavity of the first RSS to cool the power cable.

19 Claims, 11 Drawing Sheets

(56) References Cited

U.S. PATENT DOCUMENTS

| | | |
|---|---|---|
| 10,221,862 B2 | 3/2019 | Suciu et al. |
| 10,927,761 B2 | 2/2021 | Rambo |
| 2014/0079530 A1* | 3/2014 | Ferch ................. F01D 15/10 415/1 |
| 2017/0254222 A1 | 9/2017 | Zhang et al. |
| 2021/0324799 A1* | 10/2021 | Suzuki ................. B64D 33/08 |

* cited by examiner

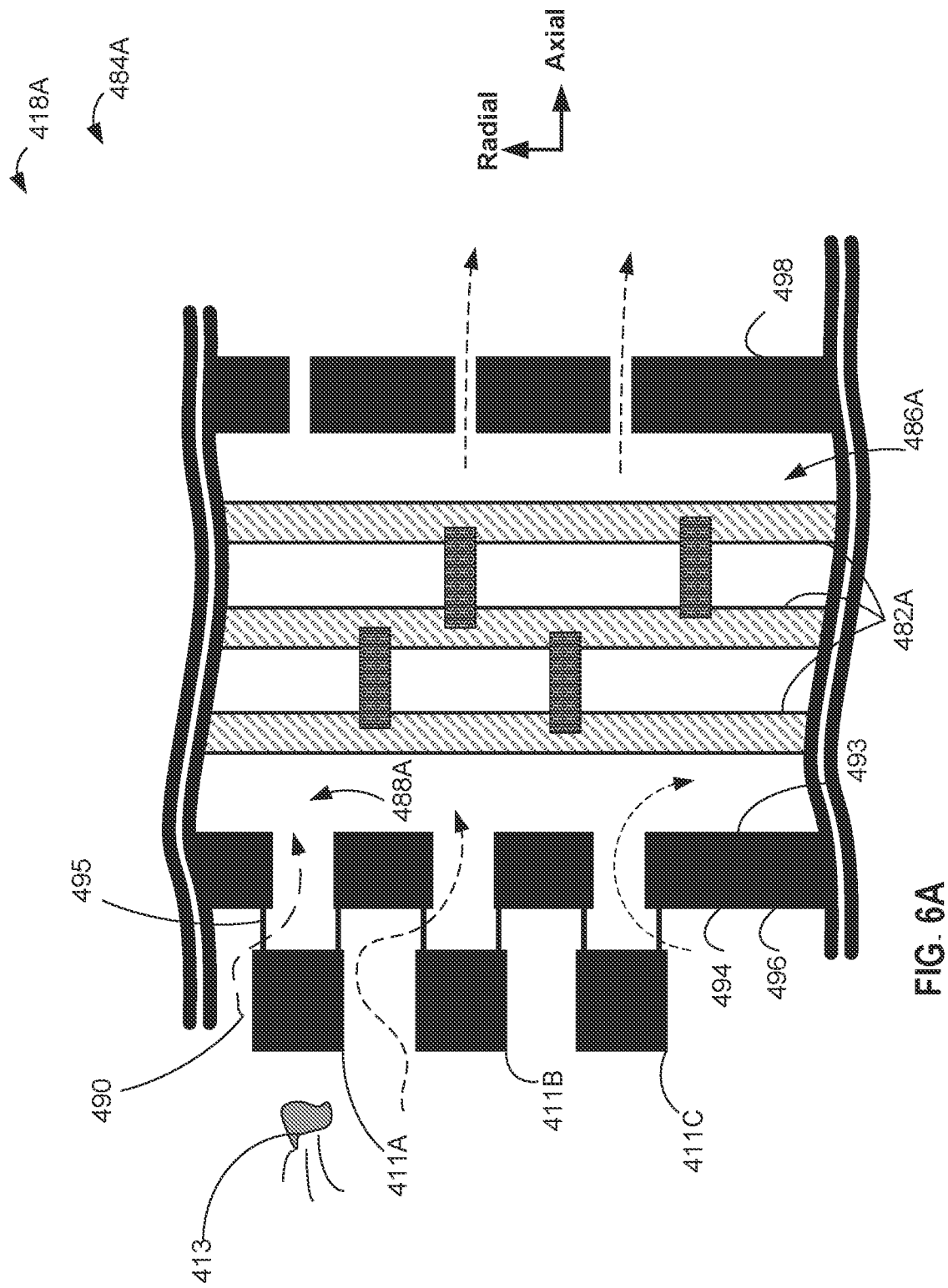

GAS TURBINE ENGINE POWER CABLE COOLING

GOVERNMENT INTEREST

This invention was made with government support under AFRL Prime contract: FA8650-19-D-2063; DO FA8650-19-F-2078. The government has certain rights in the invention.

TECHNICAL FIELD

The present disclosure relates to propulsion systems that are used, in some examples, for powered vehicles, such as aircraft.

BACKGROUND

A propulsion engine may be used to power an aircraft, or another moving vehicle such as a marine vehicle. The propulsion engine may include a gas turbine engine, an electric propulsor, or combinations thereof. One or more power cables may be used to transport electrical energy to or from one or more components of the propulsion engine, such as an associated generator, motor, sensor, or the like. The one or more power cables may be disposed in a cavity of a radial support structure disposed about the engine core.

SUMMARY

In accordance with one or more aspects of this disclosure, a propulsion engine includes at least one radial support structure (RSS) radially disposed about an engine centerline. A power cable is at least partially contained within a cavity of a first RSS or a cavity fluidically coupled to the cavity of the first RSS. The first RSS defines at least one cooling aperture fluidically coupling the cavity of the first RSS to an exterior surface of the first RSS. The at least one cooling aperture is configured to allow cooling fluid to flow into or out of the cavity of the first RSS to cool the power cable.

In accordance with one or more aspects of this disclosure, a method includes passing electrical current through a power cable at least partially contained within a cavity of a first radial support structure (RSS) or a cavity fluidically coupled to the cavity of the first RSS. The first RSS is radially disposed about an engine centerline of a propulsion engine. The method includes cooling the power cable by flowing cooling fluid through at least one cooling aperture defined by the first RSS. The at least one cooling aperture fluidically couples the cavity of the first RSS to an exterior surface of the first RSS.

The details of one or more examples are set forth in the accompanying drawings and the description below. Other features, objects, and advantages will be apparent from the description and drawings, and from the claims.

BRIEF DESCRIPTION OF THE DRAWINGS

FIGS. 6A and 6B are conceptual cross-sectional diagrams illustrating an example RSS which includes a sheltering element, from a side view and a top view, respectively.

DETAILED DESCRIPTION

In general, this disclosure describes techniques and associated systems that employ passive cooling to cool one or more power cables ("power cables") within a propulsion engine. The propulsion engine may be a gas turbine engine, another type of internal combustion engine driving a fan or propeller, or an electric propulsor driving a fan or propeller, or a gas turbine generating electrical or mechanical power that is used in propulsion. In any case, the power cables may transport electrical energy between components of a gas turbine engine, such as, for example, one or more of a controller, a sensor, or a high-power device such as a heater, motor, battery or generator.

In some examples, the power cables may be routed between components of the propulsion engine through a cavity within a radial support structure (RSS) of the propulsion engine. The RSS may be a single RSS or may be part of a plurality of RSSs, each of which extends radially from a core of the propulsion engine. In some examples, the RSS may be a strut which mechanically supports the core or components within the core or a vane which interacts with (e.g., changes a flow direction) air flowing through an engine core. Put differently, the RSS may be an airfoil or a structural component. As electrical current flows through the power cables, the power cables may become hot (e.g., due to ohmic heating). Absent cooling, the power cables may heat air within the cavity of the RSS until the temperature exceeds a critical temperature at which the power cables overheat, which may cause the power cables to lose efficiency and/or fail.

In accordance with one or more aspects of the disclosure, a cavity of a first RSS may at least partially contain a power cable, and the first RSS may define at least one cooling aperture fluidically coupling the cavity to an exterior surface of the first RSS. Cooling fluid (e.g., air flowing through a gas turbine engine or propulsor during operation) may flow through the at least one cooling aperture to cool the power cable such that the power cable is maintained below a critical temperature. In this way, the power cables may be protected from overheating by the transfer of heat generated by the power cable to cooling fluid flowing into and out of the cavity. Such a passive cooling system may be desirable in modern aircraft which may have increased power cable heating (e.g., due to increased electrical loads) relative to earlier aircraft. Furthermore, the passive cooling provided by the at least one aperture may be an elegant cooling solution that does not require additional moving parts or add additional weight.

Figure 1:
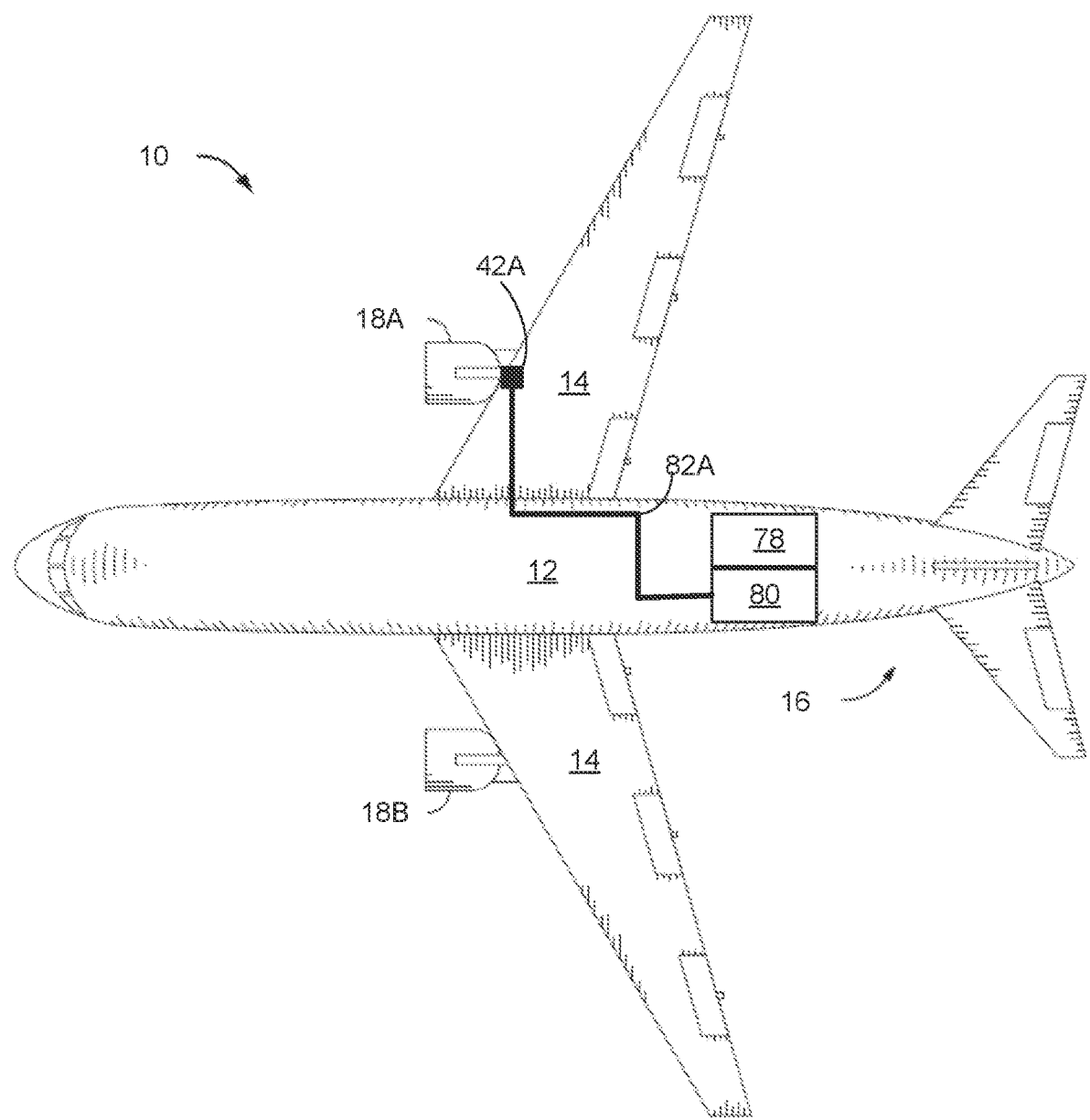
FIG. 1 is a conceptual diagram illustrating an example vehicle in accordance with an example of the present disclosure.

FIG. 1 is a conceptual diagram illustrating an example vehicle in accordance with an example of the present disclosure. In the example of FIG. 1, the vehicle includes an aircraft 10. In other examples, the vehicle may include any type of gas turbine engine-powered vehicle, including one or more types of air vehicles; land vehicles, including but not limited to, tracked and/or wheeled vehicles; marine vehicles, including but not limited to surface vessels, submarines, and/or semi-submersibles; amphibious vehicles; or any combination of one or more types of air, land, and marine vehicles. The vehicle may be manned, semiautonomous, or autonomous.

Aircraft 10 includes a fuselage 12, wings 14, an empennage 16, two gas turbine engine systems 18A and 18B (collectively, "gas turbine engines 18") as main propulsion engines. In other examples, aircraft 10 may include a single gas turbine engine 18 or a plurality of gas turbine engines 18. As illustrated in FIG. 1, aircraft 10 is a twin-engine turbofan aircraft. In some examples, aircraft 10 may be any fixed-wing aircraft, including turbofan aircraft, turbojet aircraft, and turboprop aircraft. In some examples, aircraft 10 may be a rotary-wing aircraft or a combination rotary-wing/fixed-wing aircraft (e.g., VTOL, STOL, etc.). Aircraft 10 may employ any number of wings 14. Empennage 16 may employ a single or multiple flight control surfaces. Gas turbine engines 18 may be the main propulsion systems of aircraft 10. Aircraft may also have more than two engines such as three or four engines or may have a single engine. Furthermore, although illustrated in FIG. 1 and primarily described as including gas turbine engines 18, in other examples aircraft 10 may be at least partially propelled by one or more electric propulsors.

Aircraft 10 may further comprise controller 78 electrical distribution system 80. Gas turbine engine 18A may include electric machine 42A. Electric machine 42A may be a motor (e.g., an electric starter), a generator, or be configured to act as a motor during some operating conditions of aircraft 10 and as a generator during other operating conditions of aircraft 10. In any case, electrical energy may be transported along power cable 82A between electric machine 42A and electrical distribution system 80 under control by controller 78. In some examples, power cable 82A may be at least partially contained within a cavity of a radial support structure (RSS) of gas turbine engine 82A. In some examples, power cable 82A may be prone to generate thermal energy while transporting the electrical energy, causing the cavity of gas turbine engine 18A containing power cable 82A to increase in temperature. In such a situation, power cable 82A may overheat and fail. In accordance with examples of the current disclosure, at least one cooling aperture formed in the RSS may fluidically connect the cavity with the surrounding environment. Cooling fluid may flow into the cavity to cool power cable 82A, minimizing the risk of overheating failure of power cable 82A.

Figure 2:
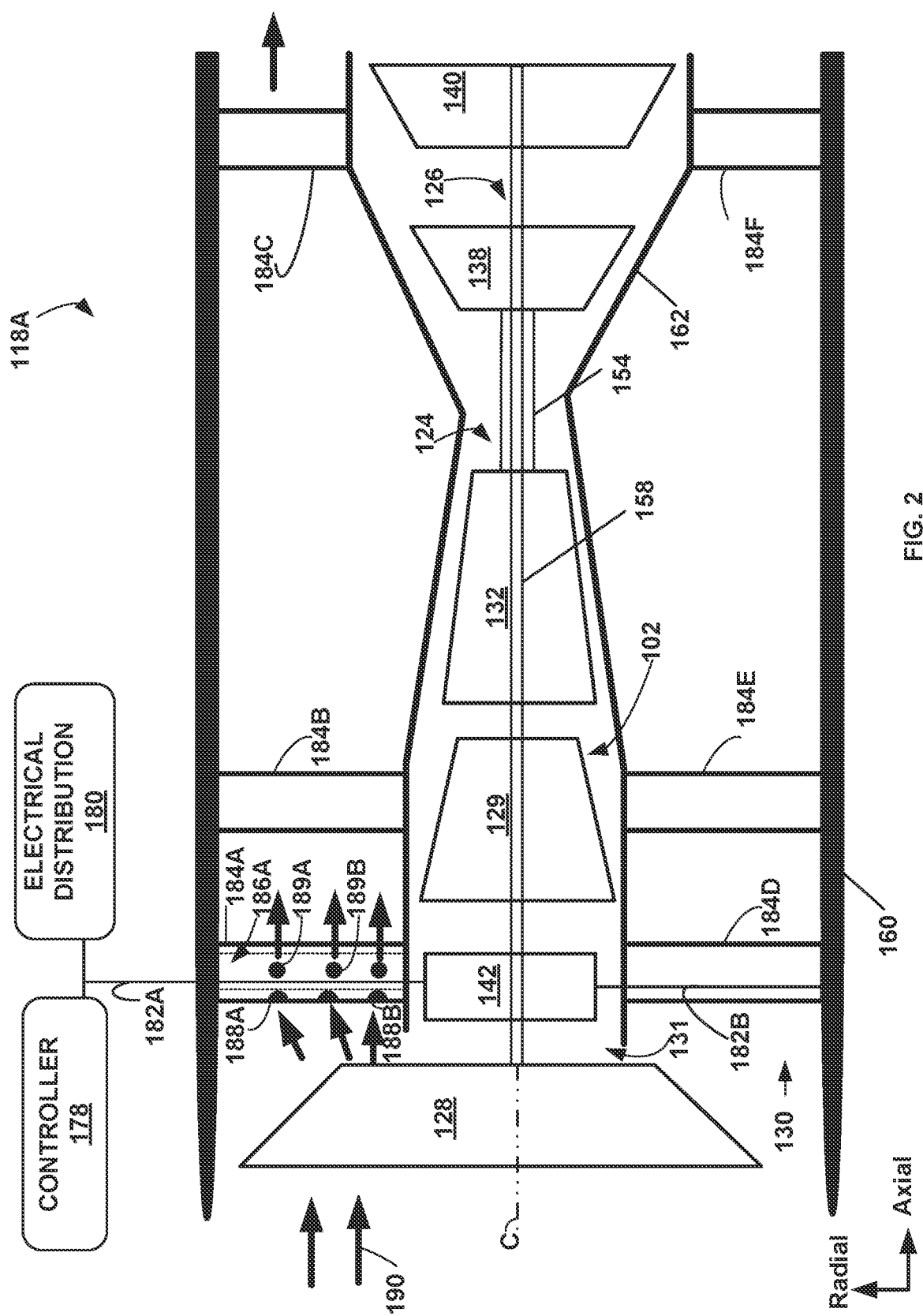
FIG. 2 is a conceptual diagram illustrating a cross-sectional view of a gas turbine engine of FIG. 1, in accordance with one or more examples of the present disclosure.

FIG. 2 is a conceptual and schematic cross-sectional diagram illustrating gas turbine engine 118A in accordance with an example of the present disclosure. Although described herein as with respect to an aircraft propulsion system, in other examples, gas turbine engine 118A may be a propulsion system for providing propulsive thrust to any type of gas turbine engine powered vehicle, as discussed above, or configured to provide power any suitable nonvehicle system including gas turbine engine 118A. Gas turbine engine 118A of FIG. 2 may be an example of gas turbine engine 18A and/or gas turbine engine 18B of FIG. 1.

Gas turbine engine 118A may be a primary propulsion engine that provides thrust for flight operations of an aircraft (10, FIG. 1). Gas turbine engine 118A includes engine core 102 mechanically supported inside nacelle 160. In the example of FIG. 2, engine 118A is a two-spool engine having a high-pressure (HP) spool (rotor) 124 and a low-pressure (LP) spool (rotor) 126. As used herein, the entire spool 124, 126 may be referred to generally as a rotor. In other examples, engine 118A may include three or more spools, e.g., may include an IP spool and/or other spools and/or partial spools, e.g., on-axis or off-axis compressor and/or turbine stages (i.e., stages that rotate about an axis that is the same or different than that of the primary spool(s)). In one form, engine 118A is a turbofan engine. In other examples, engine 118A may be any other type of gas turbine engine, such as a turboprop engine, a turboshaft engine, a propfan engine, a turbojet engine or a hybrid or combined cycle engine. As a turbofan engine, low-pressure spool 126 may be operative to drive a propulsor 128 in the form of a fan, which may be referred to as a fan system. As a turboprop engine, low-pressure spool 126 powers a propulsor 128 in the form of a propeller system (not shown), e.g., via a reduction gearbox (not shown). In other examples, propulsor 128 may take other forms, such as one or more helicopter rotors or tilt-rotor aircraft rotors, for example, powered by one or more engines 118A in the form of one or more turboshaft engines. In other examples, there may be, for example, an intermediate pressure spool having an intermediate pressure turbine or other turbomachinery components, such as those mentioned above. Although illustrated and primarily discussed below as a main propulsion engine, in some examples gas turbine engine 118A may be an auxiliary power unit (APU).

In some examples, engine 118A includes, in addition to optional propulsor 128, a bypass duct 130 defined between nacelle 160 and core case 162. Core case 162 defines the radial boundary of engine core 102. Engine core 102 includes a low-pressure compressor 129, a high-pressure (HP) compressor 132, a diffuser (not illustrated for clarity), a combustor (not illustrated for clarity), a high-pressure (HP) turbine 138, a low-pressure turbine 140, and a generator 142, which are generally disposed about engine centerline C in the axial direction. In some examples, engine centerline C is the axis of rotation of propulsor 128, LP compressor 129, HP compressor 132, HP turbine 138, LP turbine 140, and generator 142. In other examples, one or more of these components may rotate about a different axis of rotation.

In the depicted example, core case 162 defines a core duct 131 radially inside core case 162 through which air passes through engine core 102, and the bypass air flows through bypass duct 130 which is defined radially inside nacelle 160 but radially outside core 102. Although not illustrated for clarity, in some examples a combustor may be disposed between HP compressor 132 and HP turbine 138. The combustor may include a combustion liner (not shown) that contains a combustion process.

Propulsor 128 may include a fan rotor system driven by low-pressure spool 126. In various examples, propulsor 128 may include one or more rotors that are powered by turbine 140. In various examples, propulsor 128 may include one or more fan vane stages (not shown in FIG. 2) that cooperate with fan blades (not shown) of the fan rotor system to compress air and to generate a thrust-producing flow. In some examples, as mentioned above, propulsor 128 may be a propeller with a gearbox. Bypass duct 130 is operative to transmit a bypass flow generated by propulsor 128 around engine core 102 of engine 18A within nacelle 160. LP compressor 129 and HP compressor 132 each include a compressor rotor system (not shown in FIG. 2). In various examples, the compressor rotor system includes one or more rotors (not shown) that are powered by LP turbine 140 and HP turbine 138, respectively. HP compressor 132 also includes a plurality of compressor vane stages (not shown in FIG. 2) that cooperate with compressor blades (not shown) to compress air. In various examples, the compressor vane stages may include a compressor discharge vane stage and/or one or more diffuser vane stages. In one form, the some of the compressor vane stages have variable vane incidence angle and some are stationary.

HP turbine 138 includes a turbine rotor system. In various examples, the turbine rotor system includes one or more rotors having turbine blades (not shown) operative to extract power from the hot gases flowing through HP turbine 138 (not shown), to drive the compressor rotor system. HP turbine 138 also includes a plurality of turbine vane stages (not shown) that cooperate with the turbine blades of the turbine rotor system to extract power from the hot gases discharged by the combustor. In one form, the turbine vane stages are stationary. In other examples, one or more vane stages may be replaced with one or more counter-rotating blade stages. HP turbine 138 is drivingly coupled to HP compressor 132 via shafting system 154 (also referred to as high-pressure (HP) shaft 154).

Similarly, LP turbine 140 includes a turbine rotor system. In various examples, the turbine rotor system includes one or more rotors having turbine blades (not shown) operative to drive propulsor 128. LP turbine 140 may also include a plurality of turbine vane stages (not shown in FIG. 2) that cooperate with the turbine blades of the turbine rotor system to extract power from the hot gases discharged by HP turbine 138. In one form, the turbine vane stages are stationary. In some examples, the turbine rotor system is drivingly coupled to LP compressor 129 and/or propulsor 128 via shafting system 158 (also referred to as low-pressure shaft 158). In various examples, shafting systems 154 and 158 include a plurality of shafts that may rotate at the same or different speeds and directions for driving propulsor 128 rotor(s) and LP compressor 129 rotor(s). For case of description, shafting system 154 of HP spool 124 is described primarily as HP shaft 154 but is it recognized that system 154 is not limited to a single shaft. Likewise, shafting system 158 of low-pressure spool 126 is described primarily as low-pressure shaft 158 but is it recognized that system 158 is not limited to a single shaft. Turbine 140 is operative to discharge the engine 118A core flow to one or more nozzles at the axially downstream end of gas turbine engine 118A.

During normal operation of gas turbine engine 118A, air is drawn into the inlet of propulsor 128. Some of the air exhausted by propulsor 128 is directed into core duct 131 as core airflow, and some of the air is directed into bypass duct 130 as bypass flow. Either of these air streams may be referred to as cooling fluid 190 below. LP compressor 129 and HP compressor 132 pressurize the portion of the air received therein from propulsor 128, which is then discharged into a diffuser (not illustrated in FIG. 2. The diffuser reduces the velocity of the pressurized air, and directs the diffused core airflow into a combustor (not illustrated in FIG. 2). Fuel is mixed with the pressurized air in the combustor, which is then combusted. The hot gases exiting the combustor are directed into turbines 138 and 140, which extract energy in the form of mechanical shaft power to drive HP compressor 32, LP compressor 129, and/or propulsor 128 via respective HP shaft 154 and low-pressure shaft 158. The hot gases exiting turbine 140 are discharged through a nozzle system, and provide a component of the thrust output by engine 118A.

In some examples, an electric machine 142 may be connected to LP spool 126 and/or HP spool 124. Electric machine 142 may be configured as a generator which converts rotation of shaft 154 and/or shaft 158 to electrical energy, a motor which uses electrical energy to rotate shaft 154 and/or shaft 158, or be configured to switch between functioning as a motor or a generator based on the operation of gas turbine engine 118A. For example, electric machine 142 may be configured to function as an electric starter during start-up of gas turbine engine 118A, and may be further configured to function as a generator during a cruising operation of gas turbine engine 118A.

Gas turbine engine 118A includes controller 178. Controller 178 may be configured to be a converter that converts the alternating current from a generator mounted on the engine or an inverter to control a starter motor on the engine or a unit that performs both of these tasks with an electric machine mounted on the engine. The controller could also be a unit that controls power to a heater or an inverter that controls a motor driving a pump or fan as part of the engine or propulsion unit. Controller 178 may comprise any suitable arrangement of hardware, software, firmware, or any combination thereof, to perform the techniques attributed to controller 178 herein. Examples of controller 178 include any of one or more microprocessors, digital signal processors (DSPs), application specific integrated circuits (ASICs), field programmable gate arrays (FPGAs), processing circuitry, or any other equivalent integrated or discrete logic circuitry, as well as any combinations of such components. When controller 178 includes software or firmware, controller 178 further includes any necessary hardware for storing and executing the software or firmware, such as one or more processors or processing units. In some examples, all or portions of controller 178 may be embodied in a full authority digital engine control (FADEC) including an electronic engine controller (EEC) or engine control unit (ECU) and related accessories that control one or more aspects of the operation of engine system 18A. Controller 178 may be located on the engine or on the aircraft.

In general, a processing unit may include one or more microprocessors, DSPs, ASICs, FPGAs, or any other equivalent integrated or discrete logic circuitry, as well as any combinations of such components. Although not shown in FIG. 2, controller 178 may include a memory configured to store data. The memory may include any volatile or non-volatile media, such as a random access memory (RAM), read only memory (ROM), non-volatile RAM (NVRAM), electrically erasable programmable ROM (EE-PROM), flash memory, and the like. In some examples, the memory may be external to controller 178 (e.g., may be external to a package in which controller 178 is housed).

Gas turbine engine 118A further includes electrical distribution system 180. Electrical distribution system 180 includes power cables 182A, 182B (collectively "power cables 182") which transport electrical energy between components of gas turbine engine 118A. Electrical distribution system 180 may further include power cable 182B that is configured to transport electrical energy to or from electrical machine 142 to other components of gas turbine engine 118A or aircraft 10. In some examples, electrical distribution system 180 may further include one or more battery cells. It is also considered that electrical distribution system 180 may merely be a transport system configured to deliver power generated offboard vehicle 10 to components of gas turbine engine 118A. For example, electrical distribution system 180 may include hookups for connection to ground power, shore power, marine power, or the like. Such power sources may be available at a hangar, a dock, or the like.

Gas turbine engine 118A further includes a plurality of radial support structures (RSSs) 184A, 184B, 184C, 184D, 184E, 184F (collectively "RSSs 184"). In the illustrated embodiment of FIG. 2, RSSs 184 are struts which connect nacelle 160 to core case 162 such that RSSs 184 mechanically support core case 162 within nacelle 160 about engine centerline C. As such, RSSs 184 extend in a radial direction from engine core 102. Although illustrated as extending radially outward from core case 162, in some examples RSSs 184 may extend radially inward (i.e., towards engine centerline C) from core case 162. Furthermore, although described so far as struts which primarily function to mechanically support engine core 102, in some examples RSSs 184 may be airfoils within core duct 131 and/or bypass duct 130 which primarily function to act on air flowing through the engine (e.g., fan outlet vanes configured to work in concert with fan blades to remove swirl from airflow), as will be further described below. RSSs 184 may include any suitable materials with temperature resistance, strength, and toughness for inclusion in a gas turbine engine. In some examples, RSSs 184 may include a metal. The metal may be a steel, aluminum, or nickel alloy. In some examples, RSSs 184 may include a ceramic or a composite.

In some examples, RSS 184A may be hollow, which may reduce component weight. Accordingly, RSS 184A may define cavity 186A, which may be an internal void space in RSS 184. In some examples, cavity 186A may define a channel connecting nacelle 160 and core case 162. Cavity 186A may contain power cable 182A as power cable 182A as it is routed between components of gas turbine engine 118A and controller 178 or aircraft electrical distribution system 180. Positioning power cable 182A within cavity 186A in RSS 184A may provide containment for power cable 182A without additional structure to route power cable 182A through gas turbine engine 118A. Positioning power cable 182A at least partially within cavity 186A may protect power cable 182A from, for example, impact from debris in the airstream flowing through bypass duct 130 during operation.

In some examples, RSSs 184 may include RSS 184A and RSS 184D that extend radially from engine core 102 from the same or similar axial position along the axial axis. In other words, in some examples, a plurality of the plurality of RSSs including RSS 184A and RSS 184D may make up a single stage of mechanical supports or vanes. Additionally, or alternatively, RSSs 184 may include RSS 184A and RSS 184B that are displaced from each other along the axial axis. In such examples, RSS 184A and 184B may be individual RSSs of two different stages of mechanical supports or vanes of gas turbine engine 118A. Each RSS of a stage or stages of struts in the bypass flow path, engine core inlet or compressor inlet or fan exit vanes, LP compressor vanes or HP compressor inlet vanes may define one or more cooling apertures in accordance with the disclosure.

As mentioned above, power cable 182A may be contained within cavity 186A of RSS 184A. During operation of gas turbine engine 118A, power cable 182A may generate thermal energy as a byproduct of transporting electrical energy through the conductive material of the power cable as predicted by the amperage squared times resistance. For alternating current (AC) the resistance is the AC resistance which is affected by the frequency due to the skin effect of the cable. The cable resistance could be subject to relatively high electrical current, such as those required to power high-energy devices such as motors, generators, heaters, or the like, power cable 182A may generate enough thermal energy to heat air within cavity 186A above a critical temperature at which power cable 182A will lose efficiency and/or fail.

In accordance with the present disclosure, RSS 184A may include at least one cooling aperture fluidically coupling cavity 186A with an exterior surface of RSS 184A. As defined herein, and exterior surface of an RSS is a surface which is exposed to air flowing through bypass duct 130 or core duct 131 while gas turbine engine 118A is in operation. The cooling aperture is configured to allow fluid (e.g., air) to flow into or out of cavity 186A during operation of gas turbine engine 118A to cool power cable 182A. Cooling, as used herein, refers to any process which removes thermal energy from cavity 186A and/or power cable 182A during operation of gas turbine engine 118A. One or more cooling apertures defined in RSS 184A allow cooling fluid to circulate into and out of cavity 186A, absorbing and removing thermal energy generated by power cable 182A during transport of electrical energy about the system. In this way, improved performance (e.g., increased efficiency, improved reliability, and/or increased lifetime) of power cable 182A may be achieved relative to a power cable which is disposed in an RSS that does not include at least one cooling aperture.

In some examples, RSS 184A may be part of the engine bypass flow path, fan section, LP compressor section 129 or inlet stage of HP compressor section 132 of gas turbine engine 118A. RSS 184 may further include second RSS 184B. RSSs 184 may be fan exit vanes or struts, LP compressor vanes or struts or inlet HP compressor vanes or struts of gas turbine engine 118A. The first stage and second stage may be axially displaced from each other along axial axis A. Additionally, or alternatively, two RSSs as described herein may be individual RSSs 184A, 184D of a same stage of a fan or compressor section. In such examples, RSSs 184A and 184D may extend from engine core 102 at the same or a similar position along axial axis A. In some examples, each RSS of a plurality of RSSs that make up a stage may include at least one cooling aperture as described herein. However, in some examples, since not every RSS 184 in a stage necessarily includes a power cable 182A, one or more RSSs in a stage may not define a cooling aperture 188. Since inclusion of cooling apertures 188 may reduce the strength of RSS 184A when RSS 184A is configured as a strut and may reduce the aerodynamic efficiency of RSS 184A when RSS 184A is configured as an airfoil, it may be desirable to omit cooling apertures 188 from RSSs that do not include a power cable 182.

The at least one cooling aperture may include one or more inlet cooling apertures 188A, 188B (collectively "inlet cooling apertures 188") and/or one or more outlet cooling apertures 189A, 189B (collectively "outlet cooling apertures 189"). In some examples, only outlet cooling apertures 189 may be included, and cooling fluid 190 may flow into cavity 186A through a duct formed in nacelle 160 or core case 162, as will be further described below. Cooling fluid 190 may thus flow into and out of cavity 186A, transferring thermal energy generated by power cable 182A to cooling fluid 190, and thus maintaining power cable 182A below a critical temperature. In some examples, inlet cooling apertures 188 and/or outlet cooling apertures 189 may be selectively shaped, sized and/or positioned to improve heat transfer to cooling fluid 190 and minimize drag or other problems related to inclusion of the at least one cooling aperture.

Figure 3A:
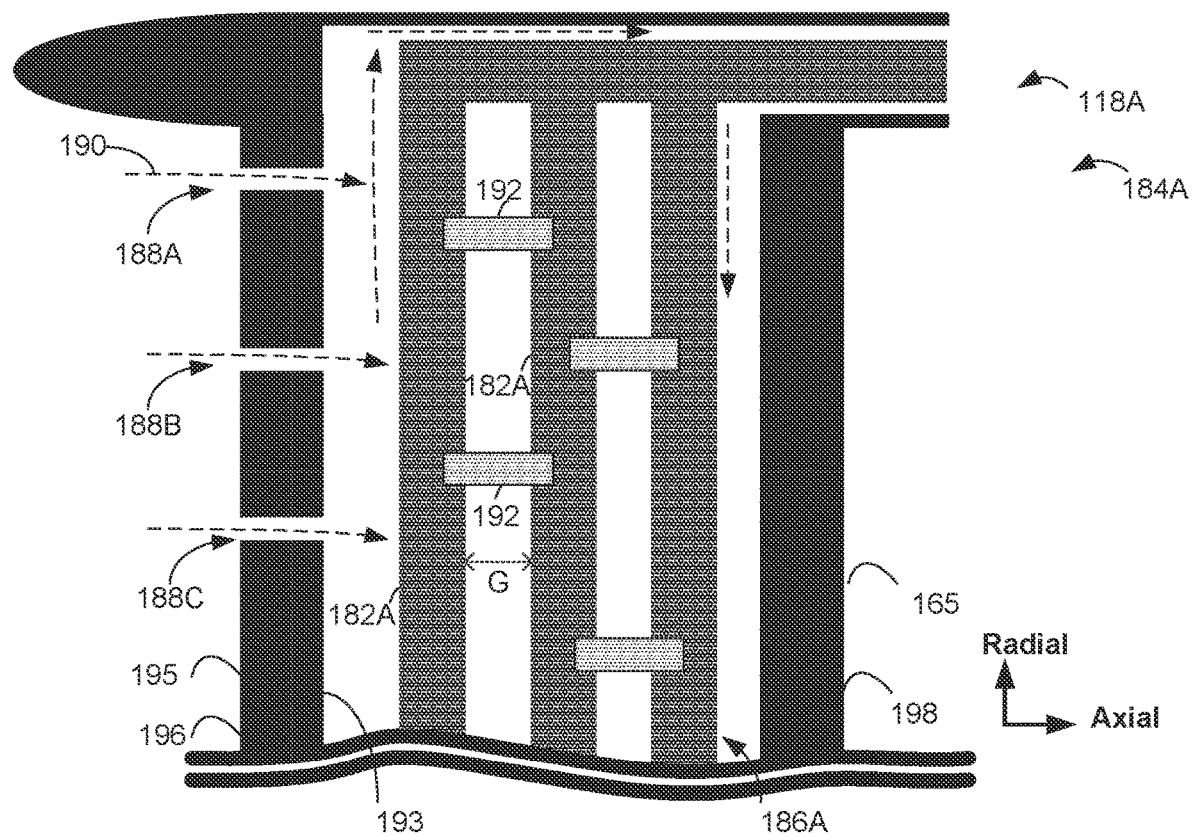
FIG. 3A is a conceptual cross-sectional side view diagram and FIG. 3B is a conceptual side view diagram illustrating the example radial support structure (RSS) of FIG. 2.
Figure 3B:
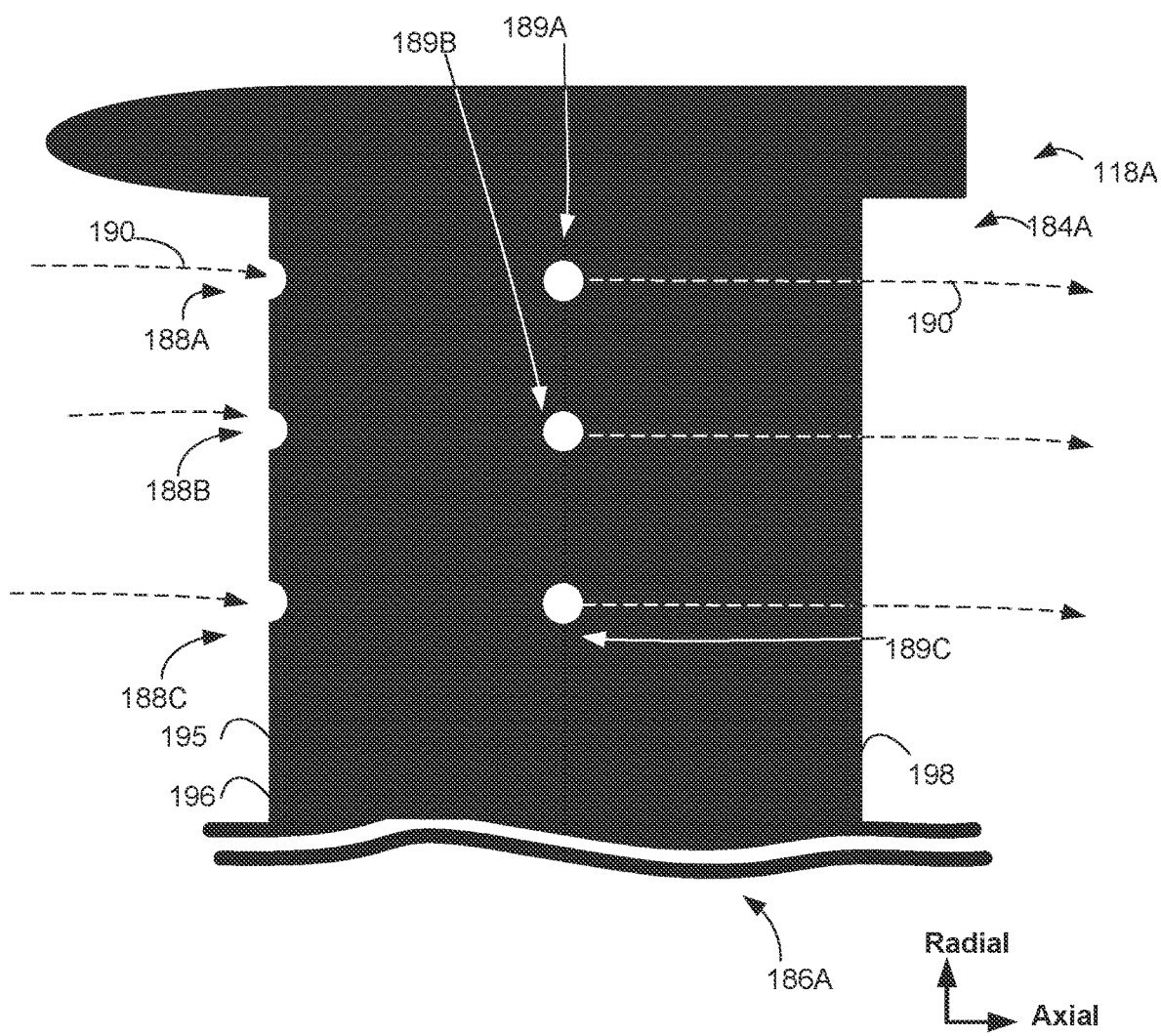
Figure 3C:
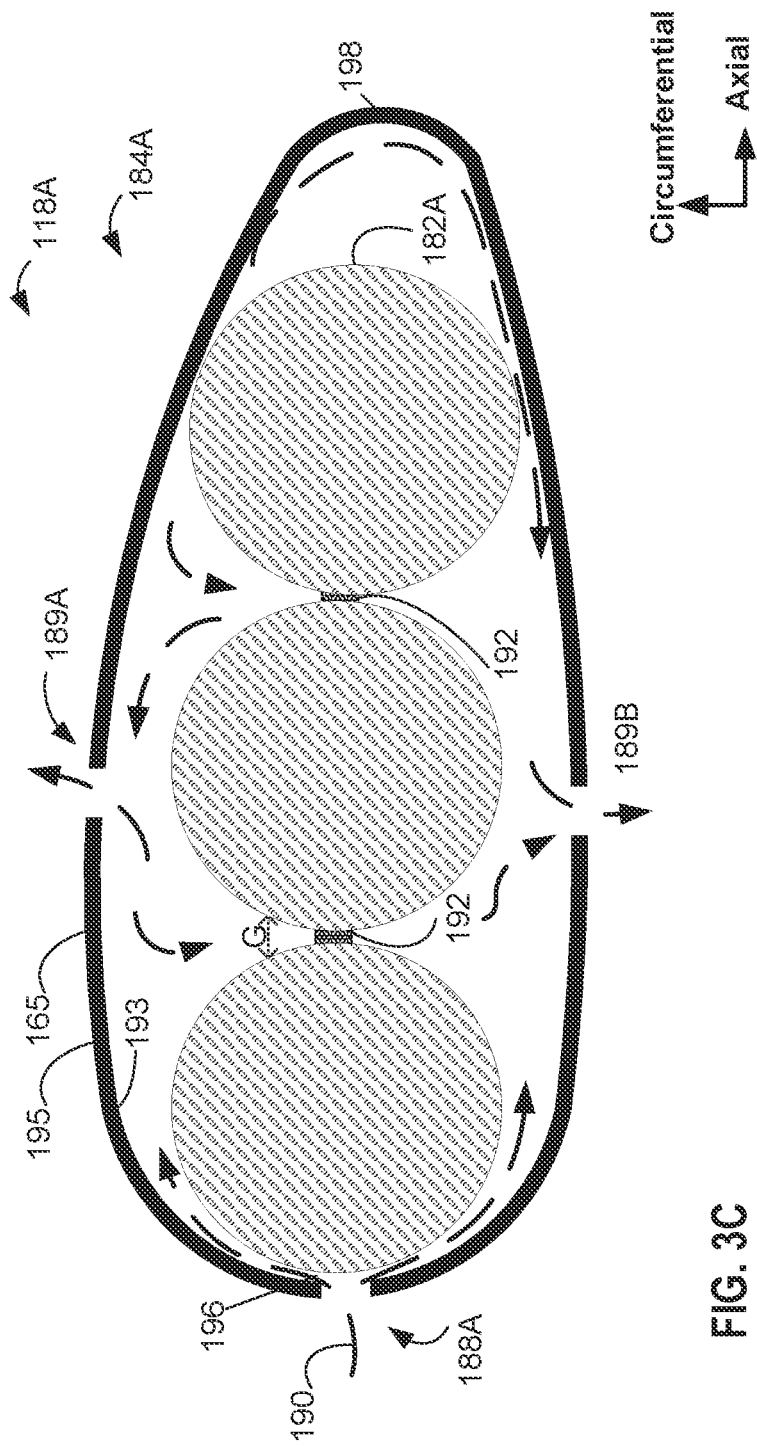
FIG. 3C is a conceptual top view diagram illustrating the example radial support structure (RSS) of FIG. 2.

FIGS. 3A-3C illustrate RSS 184A of FIG. 2 in more detail. FIG. 3A illustrates a conceptual cross-sectional view taken along axial axis A of FIG. 2; FIG. 3B is a conceptual side view (relative to FIG. 2) of RSS 184A; and FIG. 3C is a conceptual top view. RSS 184A includes inlet cooling apertures 188A, 188B, 188C (collectively, "inlet cooling apertures 188"). Inlet cooling apertures 188 may be configured to allow cooling fluid 190 to flow into cavity 186A to cool power cable 182A. RSS 184A may also define outlet cooling apertures 189A. 189B, 189C (collectively "outlet cooling apertures 189"). Outlet cooling apertures 189 may be configured to allow cooling fluid 190 to flow out of cavity 186 to the exterior of RSS 184A (e.g., into core duct 131 or bypass duct 130 (FIG. 2). In some examples, as illustrated, inlet cooling apertures 188 may be located where a positive pressure on RSS 184A during operation of gas turbine engine 118A cause cooling fluid 190 to flow into cavity 186A of RSS 184.

Figure 4A:
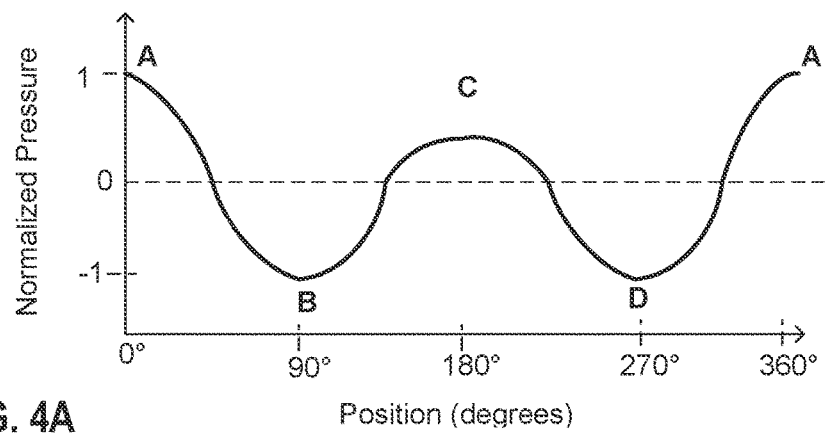
FIG. 4A is a chart illustrating the normalized pressure profile of an airfoil radial support structure (RSS) of FIG. 4B, which is illustrated from a conceptual top view.
Figure 4B:
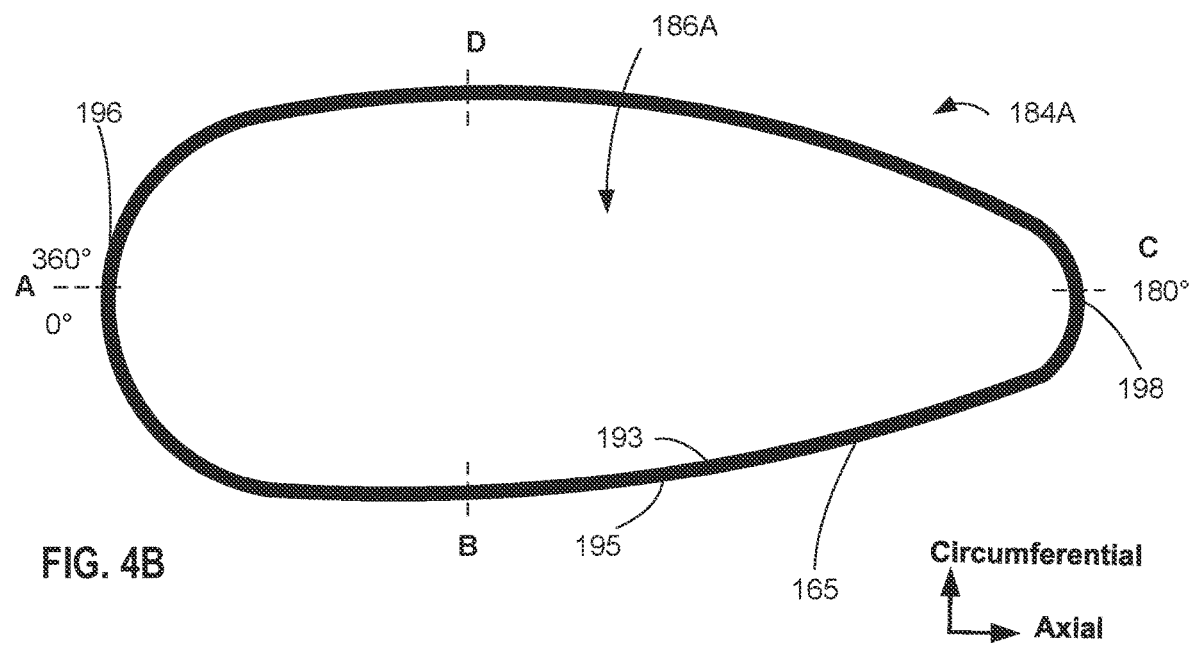
FIG. 4B is a conceptual diagram illustrating an example airfoil RSS from a cross-sectional top view, in accordance with one or more examples of the present disclosure.

In some examples, as illustrated, inlet cooling apertures 188 and/or outlet cooling apertures 189 may be positioned such that the pressure differential of cooling fluid 190 (e.g., air) flowing around the vane or strut outer surface during operation causes cooling fluid 190 to circulate through cavity 186A. As one example, FIG. 4A is a chart indicating a normalized pressure profile of RSS 184A of FIG. 4B. FIG. 4B illustrates RSS 184A from a conceptual top view, similar to the illustration of FIG. 3C, with the internal power cables removed for clarity. The chart in FIG. 4A illustrates the normalized pressure on wall 165 of RSS 184A at various positions. Points where the pressure is positive indicate a position where the fluid pressure on exterior surface 195 of wall 165 from the surrounding environment is greater than the average static pressure of the free stream of the flow at the vane or strut., such that positioning a cooling aperture in the location would be the optimum location to promote fluid to flow into cavity 186A from the surrounding environment during operation of the propulsion engine. Conversely, points where the pressure is negative indicate a position where the fluid pressure on exterior surface 195 of wall 165 from the surrounding environment is less than the average static pressure of the free stream of the flow at the vane or strut, such that positioning a cooling aperture in the location would be the optimum location to promote fluid to flow out of cavity 186A into the surrounding environment (e.g., bypass duct 130 or core duct 131 (FIG. 2)). RSS 184A defines leading edge 196 at the upstream end and trailing edge 198 at the downstream end. At location A, positioned at upstream edge 196, the positive pressure is highest. Negative pressure may be at greatest magnitude at points B and D, along the sides of RSS 184A between leading edge 196 and trailing edge 198, and there may be positive pressure at point C, which is positioned at trailing edge 198. The lower pressure along the sides of RSS 184A at points B and D may be below the free stream pressure in bypass duct 130 or core duct 131, such that cooling fluid 190 is drawn out of cavity 186A if an outlet cooling aperture 189 is placed at one or both of these positions. In some examples, the free stream pressure may be defined as the average static pressure (average total pressure minus the mean dynamic head pressure) in the plane of the vane or strut. The mean dynamic head pressure is equal to 0.5 multiplied by the density of cooling fluid 190, multiplied by the mean stream velocity squared.

In some examples, it may be advantageous to position inlet cooling apertures 188 (FIGS. 3A-3C) at points of relative positive pressure and outlet cooling apertures 189 at points of relative negative pressure, to improve passive exchange of cooling fluid 190. In this way, thermal energy generated by power cables 182A may be transferred to cooling fluid 190, reducing or eliminating overheating of power cables 182A. FIGS. 3A-C illustrate such an example, where inlet cooling apertures 188 are positioned at upstream edge 196 and outlet cooling apertures 189 are positioned along the sides of RSS 184A at points of minimum free stream pressure. However, in some examples, outlet cooling apertures 189 may be located at trailing edge 198, especially where cooling fluid 190 is sourced at higher pressure (e.g., sourced from the core engine 131 (FIG. 2)).

In order to maximize the cooling flow, it may be advantageous to locate the inlet air aperture in a strut or vane in a compressor stage located at higher pressure section of the core gas flow path and locate the outlet aperture in a strut or vane located at a lower pressure section of the core or bypass flow paths.

In order to maximize the cooling flow by taking advantage of the radial pressure profile at the exit of a fan or compressor stage at the same axial location. The inlet air aperture may be located close to the OD of the strut or vane where the air pressure is elevated. Also, the outlet air aperture may be located close to the ID of the strut or vane at lower pressure.

Referring back to FIG. 2, in some examples, to promote flow of cooling fluid 190 through cavity 186A, power cables 182A may be routed through RSS 184A which is advantageously placed in a relatively high-flow portion of bypass duct 130 or core duct 131. For example, RSS 184A may be selected such that the free stream velocity passing RSS 184A during operation (e.g., a cruising operation) is at least about Mach 0.3, such as above Mach 0.5.

In some examples, as best illustrated in FIG. 3A, power cables 182A may substantially or totally block flow of cooling fluid from flowing in axial direction A. In such examples, cavity 186A may extend or connect to another cavity formed in nacelle 160 or core case 162, such that cooling fluid 190 may flow into inlet cooling apertures 188, then in a radial direction around power cable 182A through nacelle 160 and or core case 162, and finally out of outlet cooling apertures 189 into bypass duct 130.

Inlet cooling apertures 188 and/or outlet cooling apertures 189 may vary in number, shape, and size based on the mean stream velocity of cooling fluid 190, the size of cavity 186A, the magnitude of electrical energy flowing through power cables 182A, or the like. Although illustrated and described as three circular cooling apertures 188 at the extreme upstream end 196 and three outlet cooling apertures 189 on each side of RSS 184A in FIGS. 3A-3C, it should be understood that any suitable number of cooling apertures may be employed. In some examples, the number, size and positioning of cooling apertures 188 may be selected to ensure cooling fluid 190 circulates along the entire radial length of cavity 186A at a flow rate high enough to maintain power cables 182A below a critical temperature. It should be understood that in examples where inlet cooling apertures 188A, 188B, and 188C are positioned at leading edge 196, such apertures need not be located exactly at the most upstream point of RSS 184A. Rather, inlet cooling apertures 188 are considered positioned on an upstream portion of RSS 184A when they are disposed in a positive pressure region near upstream edge 196 (FIG. 4A).

Although illustrated as a simple elliptical shape in FIGS. 3A-3C and illustrated in FIG. 2 as a mechanical strut mechanically supporting engine core 102 within bypass duct 130, it is understood that RSS 184A may extend radially inward of core case 162. In such examples, RSS 184A may be a compressor vane or strut. The compressor section may include multiple stages, each stage comprising a plurality of vanes. Any or all of the plurality of vanes in a first stage or a second stage may define cavities and/or cooling apertures as illustrated in FIGS. 3A and 3B.

In examples where RSS 184 is a fan or compressor vane or strut, RSS 184A may primarily function as an airfoil configured to modify the flow of cooling fluid 190 (e.g., air) through gas turbine engine 118A. In such examples, RSS 184A may define a more complex shape than illustrated in FIGS. 3A-3C, and may include inlet cooling apertures 188 in positive pressure regions and outlet cooling apertures in negative pressure regions, such that cooling fluid 190 flows about all or nearly all of power cables 182A while gas turbine engine 118A is in operation.

In some examples, as illustrated, power cable 182A may include more than one discrete power cable. In the illustrated example of FIGS. 3A-3C, three separate power cables make up power cable 182A, although one or any other suitable number of cables may be employed depending on electrical requirements, flexibility requirements, or the like. In any case, power cables 182A may include at least a first power cable and a second, separate power cable. Power cables 182A, when comprising more than one individual power cable, may optionally be bundled or otherwise mechanically fixed to each other.

In some examples, power cables 182A may be separated by spacer(s) 192. Spacer(s) 192 may be configured to maintain a displacement between at least a portion of power cables 182, such that cooling fluid 190 may flow around a perimeter of power cables 182. As such, inclusion of spacer(s) 192 may improve heat transfer to cooling fluid 190 by allowing cooling fluid 190 to flow over a relatively larger proportion of the surface area of power cables 182A that otherwise would flow in examples which do not include spacer(s) 192. Spacer(s) 192 may separate first power cable and second power cable of power cables 182A by gap G. Gap G may define a path for cooling fluid 190 to flow around a cross-sectional perimeter of the first power cable and the second power cable. Spacer 192 may also be designed to separate the cables to reduce the eddy current losses by reducing the proximity effect caused by the high frequency electricity in close proximity adjacent cables.

Cooling apertures 188, 189 fluidically connect cavity 186A to exterior surface 195 of RSS 184A. In the illustrated example interior surface 193 defines cavity 186A, while exterior surface 195 is contacted by cooling fluid flowing through bypass duct (130, FIG. 2) or core duct (131, FIG. 2). Cooling aperture 188A fluidically connects interior surface 193 and exterior surface 195 through the thickness of the wall of RSS 184A.

Cooling apertures 188, 189 may define any suitable size and shape for maintaining the temperature of power cables below a critical temperature. Relatively large cooling apertures 188, 189 may provide for increased flow of cooling fluid 190 through cavities 186 and thus increased cooling. However, solid RSSs 184 may provide electromagnetic interference (EMI) shielding for electromagnetic forces generated by electrical energy flowing through power cables 182. In other words, RSSs 184 may act as a Faraday cage for power cables 182A. As such, larger cooling apertures 188, 189 may decrease the EMI shielding effect of a solid wall of RSSs 184. Accordingly, cooling apertures 188, 189 may be sized to both maintain the temperature of power cables 182A below a critical temperature during operation of the gas turbine engine and provide electromagnetic interference (EMI) shielding. In general, the frequency and/or wavelength of radiated emissions through cooling apertures 188, 189 may be limited by the cross-sectional area of the cooling aperture. Therefore, inlet cooling apertures 188A, 188B, 188C and/or outlet cooling apertures 188D, 188E, 188F may be selectively tailored to be small enough to prevent emission of electromagnetic waves below a frequency and/or wavelength of concern.

In some instances, cooling apertures 188, 189 may define a maximum dimension of from about 0.05 inches to about 1.0 inches. About, as used herein, encompasses the stated value and those values within 10% of the stated value. Sizing cooling apertures 188, 189 within this range may reduce electromagnetic interference effects on one or more components within gas turbine engine 118A. Furthermore, in some examples, cooling apertures 188 may define similar shapes or shapes that vary from each other. In some examples, cooling apertures 188, 189 may define a shape selected from the group consisting of a circle, an oval, an ellipse, or a slot.

Figure 5:
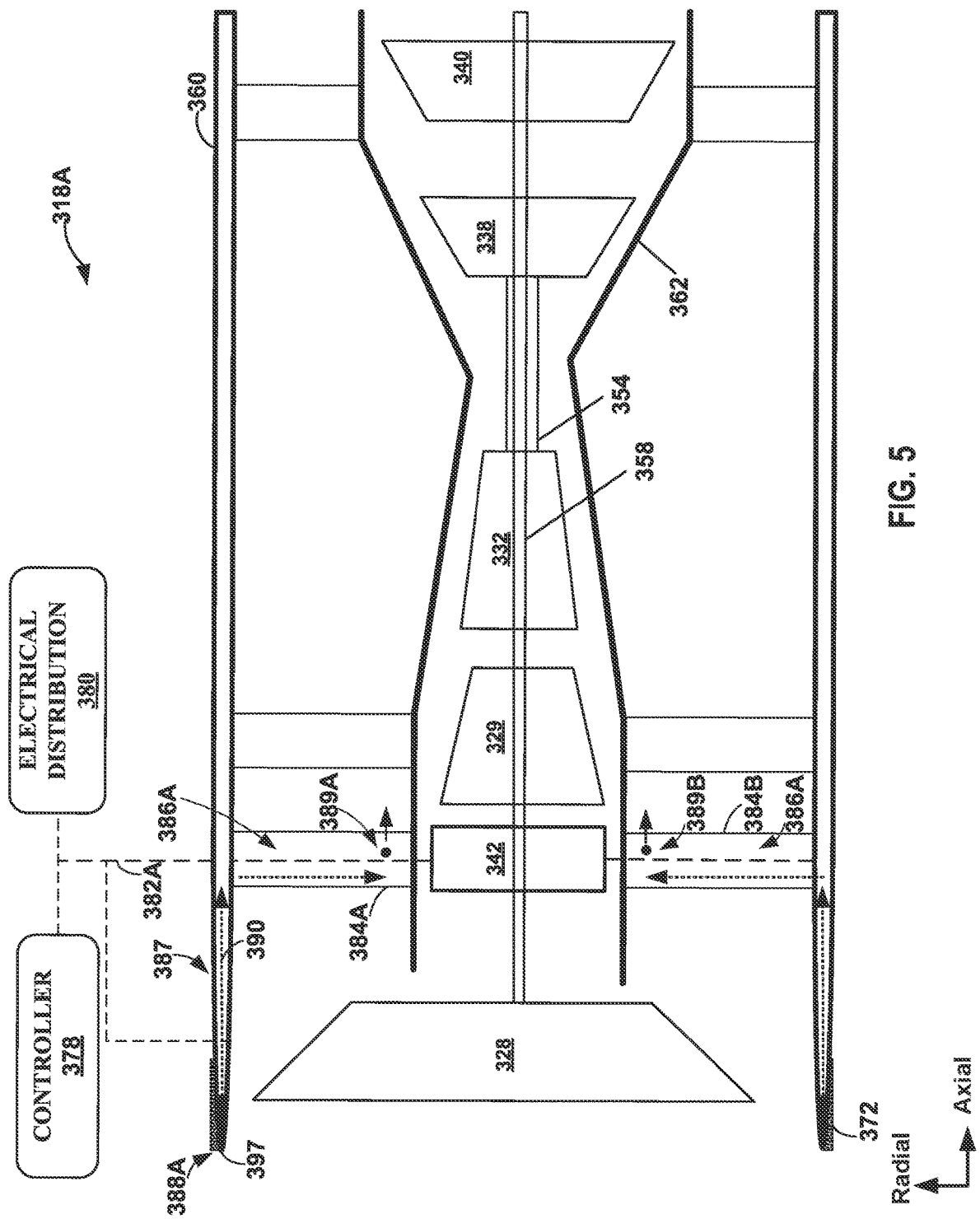
FIG. 5 is a conceptual diagram illustrating a cross-sectional view of an example gas turbine engine, in accordance with one or more examples of the present disclosure.

FIG. 5 is a conceptual diagram illustrating gas turbine engine 318A from a cross-sectional view. Gas turbine engine 318A may generally be described similarly to gas turbine engine 118A of FIG. 2, differing as described below. Similar reference numerals in FIG. 5 refer to similar elements described by FIG. 2. Some reference numerals are omitted for clarity.

In some examples, inlet cooling aperture 388A may be defined on leading edge 397 of nacelle 360, rather than or in addition to being defined on RSS 384A. In such instances, channel 387 may be a passageway fluidically coupling inlet cooling aperture 388A and cavity 386A of RSS 384A. Channel 387 may be considered an adjoining cavity to cavity 386A through RSS 284A. Accordingly, cooling fluid 390 may be received at cooling aperture 388A, routed to cavity 386A through channel 387 where it absorbs thermal energy generated by power cables 382, and evacuated through outlet cooling aperture 389A. It may be desirable to route cooling fluid in this way because cooling fluid 390 is generally colder at leading edge 397 of nacelle 360 than at any other point within gas turbine engine 318. As such, cooling fluid 390 captured at upstream end 389 and routed to power cable 382, which may be hot from operating at a high electrical load and/or over a relatively long duration, may have relatively more cooling capacity than cooling fluid captured elsewhere. In some examples, power cable 382A may only be routed through channel 387 and not RSS 384A, and cooling fluid 390 may follow the same gas flow path. Thus, outlet cooling aperture 389A may be employed to cool a power cable that is not disposed within a cavity of the RSS.

In some examples, a nacelle anti-icing heater 372 may be included at or near the leading edge of nacelle 360 to prevent ice build-up on the leading edge of the nacelle. Anti-icing heater 372 may be configured to reduce or prevent ice from building up and blocking inlet cooling aperture 388A. In some examples, anti-icing heater 372 may be an electrical heater mat positioned on a portion of nacelle 360, on either the interior or exterior surface. In some examples, anti-icing heater 372 may be an electric heater that includes an induction coil that increases in temperature responsive to an electric current. Anti-icing heater 372 may be a supplement to the anti-icing provided by power cables 182 themselves. For example, if inlet cooling apertures 188 become blocked with ice, the reduced flow of cooling fluid 390 may cause the temperature in channel 387 and/or cavity to 386A to increase until the ice melts and the blockage goes away. Furthermore, during icing conditions the temperature margin between the critical temperature at which power cable 382A will fail will be greater than the temperature margin in warmer conditions, such that overheating power cables 382 may be a reduced concern under these conditions.

Figure 6B:
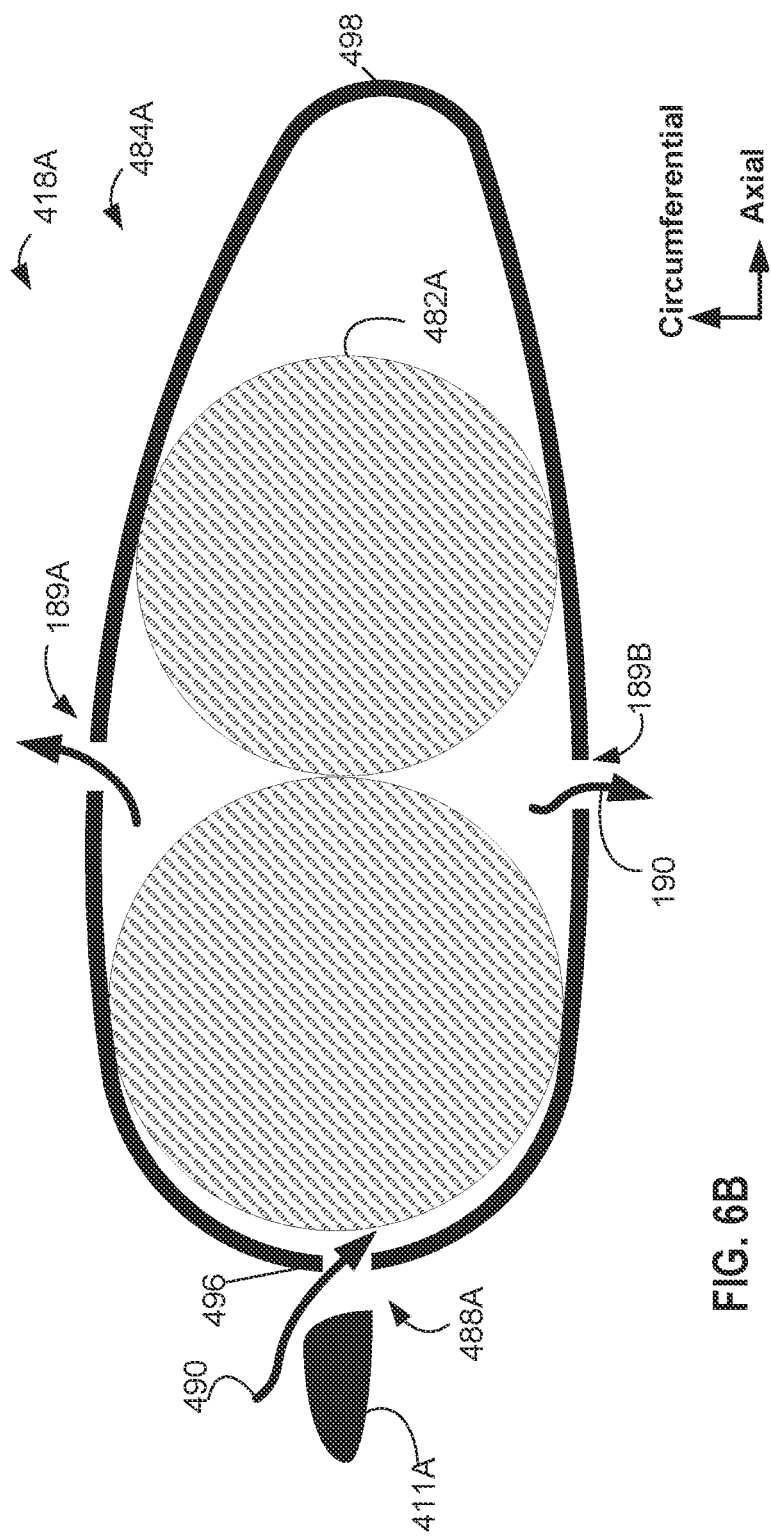

FIGS. 6A and 6B are conceptual cross-sectional diagrams illustrating RSS 484A of gas turbine engine 418A. RSS 484A may be an example of RSS 184 of FIG. 2-4B. RSS 484A may be generally described similarly to RSS 184A above, where similar reference numerals indicate similar elements. In some examples, RSSs according to the current disclosure may be vulnerable to plugging or clogging of cooling aperture 488A by debris 413. Debris 413 may be solid material or materials such as sand, ice, or the like which enters gas turbine engine 418A during operation. In some examples, RSSs 484 may include sheltering elements 411A, 411B, 411C that provide protection for inlet cooling apertures 488 from contamination by debris 413.

In some examples, sheltering element 411A may be positioned over (e.g., in the airstream approaching) inlet cooling aperture 488A. In this way, sheltering element 411A may block debris 413 from entering cooling aperture 488A, while allowing cooling fluid 490 to pass by and enter cooling aperture 488A. In some examples, sheltering element 411A may be shaped to minimize disturbance of the stream of fluid in bypass duct 130 or core duct 131. For example, sheltering elements 411 may be shaped as a small airfoil. In such instances, sheltering elements may define multiple surfaces or combinations of surfaces, baffles, meshes or the like configured to reduce contamination of cooling apertures 488 by debris and/or reduce drag. Inclusion of sheltering elements 411 may, in some examples, improve performance of power cables 482A and thus gas turbine engine 418A by preventing debris build-up in inlet cooling apertures 488.

Figure 7:
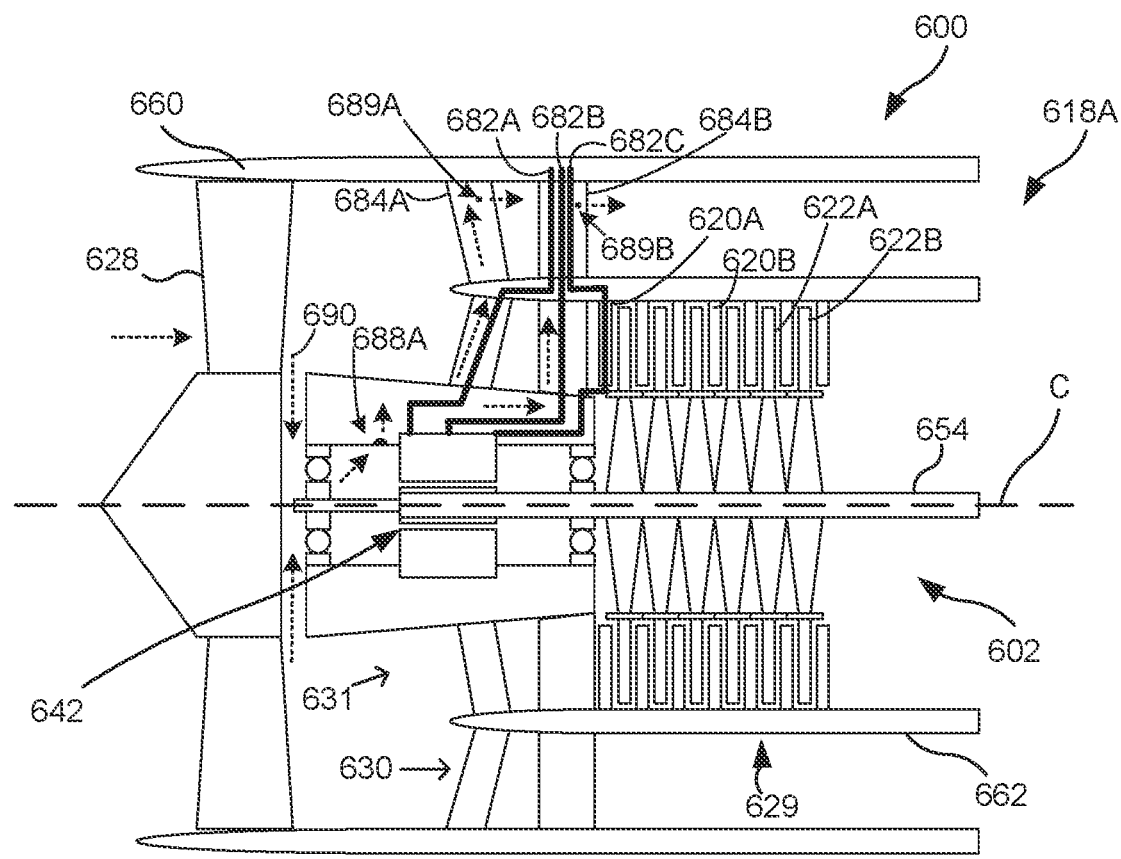
FIG. 7 is a conceptual cross-sectional diagram illustrating an example gas turbine engine, in accordance with one or more examples of the present disclosure.

FIG. 7 is a cross-section side view diagram illustrating an example gas turbine engine 618A. Gas turbine engine 618A may generally be described similarly to gas turbine engine 18A of FIG. 1, gas turbine engine 118A of FIG. 2, and/or gas turbine engine 318A of FIG. 5, where similar reference numerals indicate similar elements.

Gas turbine engine 618A includes electric machine 642. As illustrated, electric machine 642 is positioned forward of compressor section due to a relatively lower temperature upstream of the compressor section and/or ease of accessibility of electric machine 642. As described above, electric machine 642 may be connected to other components of gas turbine engine 618A or aircraft 600 by power cables 682. Power cables 682A and 682C may be routed through RSSs 684A and RSS 684B, respectively, as described above. RSS 684A and RSS 684B may define outlet cooling apertures 689A and outlet cooling aperture 689B, respectively.

In the illustrated example of FIG. 7, compressor section 629 is shown in more detail. Compressor section 629 includes alternating stages of compressor blades 622 and compressor vanes 620. Compressor blades 622 are fixed to shaft 654 and configured to rotate about engine centerline C with shaft 654. Compressor vanes 620 are stationary, and extend radially from core case 662 towards engine centerline C. Compressor vanes 620 may be airfoils configured to modify the flow of air through gas turbine engine 618A during operation. Compressor vanes 620 and compressor blades 622 work in concert to compress air for combustion during operation.

In some examples, compressor vane 620A may define a cavity (not illustrated for clarity) that at least partially contains power cable 682C. Compressor vane 620A may define an outlet cooling aperture configured to fluidically couple allow cooling fluid 690 into the cavity to cool power cable 682C, as described above.

Furthermore, as illustrated in FIG. 7, core case 662 or a core component of engine core 602 may define inlet cooling aperture 688A. In such examples, cooling fluid 690 receive cooling fluid 690 passing through core duct 631 and route cooling fluid 690 through RSSs 684A and 684B to outlet cooling apertures 689A and 689B, respectively. Outlet cooling apertures 689 may be configured to expel cooling fluid into bypass duct 630, core duct 631, or both.

Figure 8:
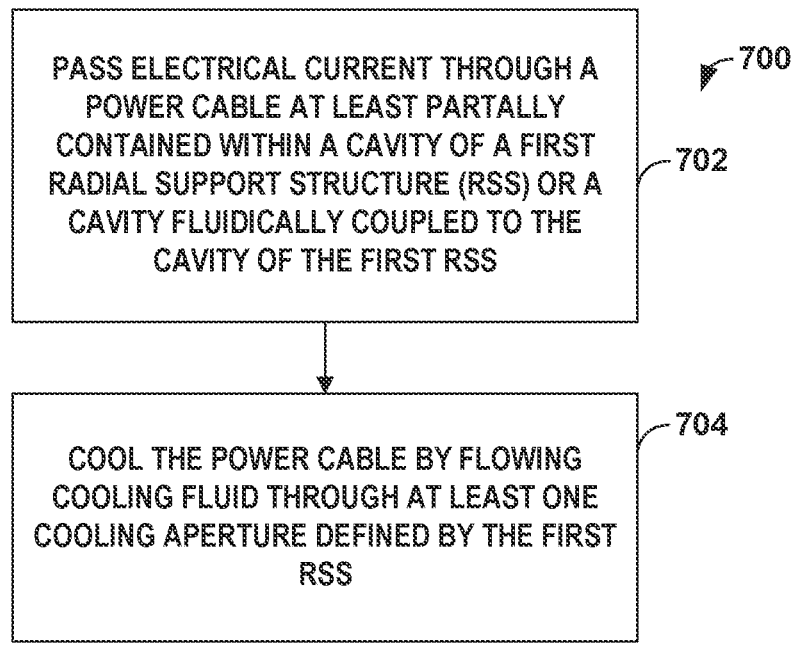
FIG. 8 is a flow diagram illustrating an example technique according to the present disclosure.

FIG. 8 is a flow diagram illustrating an example technique 700 according to the present disclosure. Technique 700 may be employed to minimize or prevent the risk of overheating power cables in a gas turbine engine. Technique 700 is described herein with reference to aircraft 10 of FIG. 1, gas turbine engine 118A of FIG. 2, RSS 184A of FIGS. 3A-4B, gas turbine engine 318A of FIG. 5, RSS 484A of FIGS. 6A-6B, and gas turbine engine 618A of FIG. 7. However, it should be understood that the described structures may be used to perform other techniques, and technique 700 may be performed using other structures.

With concurrent reference to FIGS. 2 and 8, technique 700 includes passing electrical current through power cable 182A at least partially contained within cavity 186A of first radial support structure (RSS) 184A. RSS 184A is radially disposed about engine centerline C of gas turbine engine 118A (702). With concurrent reference to FIGS. 3A-3C and 8, in some examples, passing electrical current through power cables 182A may include passing electrical current through more than one discrete power cable (e.g., a first power cable, a second power cable, and/or a third power cable at least partially contained by cavity 186A). In some examples, the technique of FIG. 8 may include spacing first and second power cables 182A apart from each other by inserting spacer 192 between power cables 182A. In some examples, forming the separation between the power cables 182A (as gap G) may comprise defining a path for cooling fluid 190 to flow around a cross-sectional perimeter of the first power cable and the second power cable 182A. In some examples, passing electrical current though power cable 182A may further include supplying or receiving electrical energy from a high-power device. In some examples, a high-power device may include one or more of a heater, a motor, or a generator.

Referring to FIGS. 2-3C and FIG. 8, technique 700 further includes cooling power cable 182A by flowing cooling fluid 190 through at least one cooling aperture 188, 189 defined by first RSS 184A (704.) Cooling apertures 188, 189 fluidically couple cavity 186A of first RSS 184A to exterior surface 195 of first RSS 184A. In some examples, technique 700 may include flowing cooling fluid 190 into cavity 186A through inlet cooling aperture 188A and out of cavity 186A through outlet cooling aperture 189A. Inlet cooling aperture 188A may be disposed on a positive pressure portion of RSS 184A at or near leading edge 196. Outlet cooling aperture 189A may be disposed along a side of RSS 184A in a negative pressure region. Alternatively, in some examples, outlet cooling aperture may be positioned at or near trailing edge 198. In some examples, leading edge 196 may be the most upstream point of RSS 184A relative to the flow of cooling fluid 190 through gas turbine engine 118A. Similarly, trailing edge 198 may be the most downstream point relative to the flow of cooling fluid 190 through gas turbine engine 118A, of and downstream direction may be defined relative to the flow of air axially through gas turbine engine 118A during operation (e.g., during a flight). With concurrent reference to FIGS. 5 and 8, in some examples, cooling power cable 382 may include flowing cooling fluid 390 through channel 387 in nacelle 360. Channel 387 may define a passageway, cavity, or duct fluidically coupling upstream end 389 of nacelle 360 with cavity 386A of RSS 384A. In other words, channel 387 may be a cavity that adjoins cavity 386A. In some examples, power cable 382A may be disposed in channel 387. For instance, power cable 382A may be disposed in channel 387 but not in cavity 386A.

RSS 184A may be configured to primarily function either as a mechanical support or as an airfoil. In some examples, RSS 184A may be a strut extending radially from engine core 102 through bypass duct 130 to nacelle 160. Additionally, or alternatively, RSS 184A may be an airfoil configured to modify a flow of cooling fluid 190 through gas turbine engine 118A. In such examples, with reference to FIG. 7, the RSS may be compressor inlet vane 620A of a plurality of compressor vanes 620 radially extending from core case 162 toward engine centerline C.

In some examples, RSS 184A may be a fan exit vane of gas turbine engine 118A. RSS 184 may further include second RSS 184B. RSS 184B may be part of a bypass flow strut or compressor inlet vane of gas turbine engine 118A. The vanes or struts may be axially displaced from each other along the axial axis. Additionally, or alternatively, two RSSs as described herein may be individual RSSs 184A, 184D of a same stage (i.e., both located at the fan exit or both located at the compressor) . . . . In such examples, RSSs 184A and 184D may extend from engine core 102 at the same or a similar position along the axial axis. In some examples, each RSS of a plurality of RSSs that make up a stage may include at least one cooling aperture 188, 189 as described herein. However, in some examples, since not every RSS 184 in a stage necessarily includes a power cable 182A, one or more RSSs 184 in a stage may not define a cooling aperture 188, 189. Since inclusion of cooling apertures 188, 189 may reduce the strength of RSS 184A when RSS 184A is configured as a strut and may reduce the aerodynamic efficiency of RSS 184A when RSS 184A is configured as an airfoil, it may be desirable to omit cooling apertures 188, 189 from RSSs that do not include a power cable disposed within.

In some examples, cooling power cable 182A may include flowing cooling fluid 190 through at least two inlet cooling apertures 188A, 188B disposed on an upstream portion of first RSS 184A at or near (e.g., in a positive pressure portion that contains) leading edge 196. Similarly, in some examples, flowing cooling fluid 190 to cool power cable 182A may include flowing cooling fluid 190 through at least two outlet cooling apertures 189A, 189B disposed on a negative pressure portion of first RSS 184A.

In some examples, technique 700 may include sizing cooling apertures 188, 189 to both maintain the temperature of the power cable 182A below a critical temperature during operation of gas turbine engine 118A and provide electromagnetic interference (EMI) shielding for cavity 186A. Accordingly, technique 700 may include forming cooling apertures 188, 189 with a maximum dimension of from about 0.05 inches and about 1.0 inches. Additionally, or alternatively, with concurrent reference to FIGS. 6A and 6B, technique 700 may further include providing protection from contamination by debris 413 of inlet cooling aperture 488A by including sheltering element 411A.

The techniques described herein also apply to gas turbines that are used to create electrical power for purposes other than propulsion.

Various examples have been described. These and other examples are within the scope of the following examples and claims.

Example 1: A propulsion engine includes at least one radial support structure (RSS) radially disposed about an engine centerline; and a power cable at least partially contained within a cavity of a first RSS or a cavity fluidically coupled to the cavity of the first RSS; wherein the first RSS defines at least one cooling aperture fluidically coupling the cavity of the first RSS to an exterior surface of the first RSS, the at least one cooling aperture configured to allow cooling fluid to flow into or out of the cavity of the first RSS to cool the power cable.

Example 2: The propulsion engine of example 1, wherein the at least one cooling aperture includes a first cooling aperture configured as an inlet cooling aperture to the cavity of the first RSS and a second cooling aperture configured as an outlet cooling aperture from the cavity of the first RSS.

Example 3: The propulsion engine of any of examples 1 and 2, wherein the outlet cooling aperture is disposed at a negative pressure location of the exterior surface of the first RSS.

Example 4: The propulsion engine of any of examples 1 through 3, wherein the first cooling aperture is disposed on the leading edge of the first RSS relative to a cooling fluid flow path through the gas turbine engine.

Example 5: The propulsion engine of any of examples 1 through 4, wherein the first RSS is an airfoil or vane configured to modify a flow of the cooling fluid through the gas turbine engine placed in a location of high air flow velocity.

Example 6: The propulsion engine of any of examples 1 through 5, wherein the first RSS is a strut configured to mechanically support a core component of the gas turbine engine placed in a location of high air flow velocity.

Example 7: The propulsion engine of any of examples 1 through 6, further includes a second RSS radially disposed about the engine centerline, wherein the second RSS defines at least one cooling aperture fluidically coupling a cavity of the second RSS to an exterior surface of the second RSS, the cooling aperture configured to allow fluid to flow into or out of the cavity.

Example 8: The propulsion engine of example 7, wherein the second RSS is axially displaced from the first RSS along the engine centerline.

Example 9: The propulsion engine of any of examples 7 and 8, wherein the second RSS is radially disposed about the engine centerline at a same location along an axial axis as the first RSS.

Example 10: The propulsion engine of any of examples 1 through 9, where the at least one cooling aperture includes at least two inlet cooling apertures or at least two outlet cooling apertures.

Example 11: The propulsion engine of any of examples 1 through 10, wherein the at least one cooling aperture is sized to both maintain the temperature of the power cable below a critical temperature during operation of the gas turbine engine and provide an electromagnetic interference (EMI) shield.

Example 12: The propulsion engine of example 11, wherein the at least one cooling aperture defines a maximum dimension of from about 0.05 inches and about 1.0 inches.

Example 13: The propulsion engine of any of examples 1 through 12, where the at least one cooling aperture defines a shape selected from the group consisting of a circle, an oval, an ellipse, or a slot.

Example 14: The propulsion engine of any of examples 1 through 13, further includes a nacelle, wherein the nacelle defines a channel fluidically coupling an inlet cooling aperture formed in the nacelle with the cavity of the first RSS.

Example 15: The propulsion engine of any of examples 1 through 14, wherein the power cable is a first power cable, and wherein a second power cable is at least partially disposed within the cavity of the first RSS.

Example 16: The propulsion engine of example 15, further comprising a spacer separating the first power cable and the second power cable, the separation between the first power cable and the second power cable defining a path for the fluid to flow around a cross-sectional perimeter of the first power cable and the second power cable.

Example 17: The propulsion engine of any of examples 1 through 16, further comprising a sheltering element that provides protection for the at least one cooling aperture from contamination by debris.

Example 18: The propulsion engine of any of examples 1 through 17, further includes a high power device, wherein the power cable transports electrical energy between the high power device and one or more other components of an aircraft that includes the high power device, and wherein the high power device comprises one or more of: an electric generator, an electric motor, and an electric heater.

Example 19: An aircraft comprising the propulsion engine of any of examples 1 through 18.

Example 20: A method includes passing electrical current through a power cable at least partially contained within a cavity of a first radial support structure (RSS) or a cavity fluidically coupled to the cavity of the first RSS, wherein the first RSS is radially disposed about an engine centerline of a propulsion engine; and cooling the power cable by flowing cooling fluid through at least one cooling aperture defined by the first RSS, wherein the at least one cooling aperture fluidically couples the cavity of the first RSS to an exterior surface of the first RSS.

What is claimed is:

1. A propulsion engine comprising:
    at least one radial support structure (RSS) radially disposed about an engine centerline; and
    a power cable at least partially contained within a cavity of a first RSS or a cavity fluidically coupled to the cavity of the first RSS;
    wherein the first RSS defines at least one cooling aperture fluidically coupling the cavity of the first RSS to an exterior surface of the first RSS, the at least one cooling aperture configured to allow cooling fluid to flow into or out of the cavity of the first RSS to cool the power cable, and wherein the at least one cooling aperture is sized to both maintain a temperature of the power cable below a critical temperature during operation of the engine and provide an electromagnetic interference (EMI) shield.

2. The propulsion engine of claim 1, wherein the at least one cooling aperture includes a first cooling aperture configured as an inlet cooling aperture to the cavity of the first RSS and a second cooling aperture configured as an outlet cooling aperture from the cavity of the first RSS.

3. The propulsion engine of claim 2, wherein the outlet cooling aperture is disposed at a negative pressure location of the exterior surface of the first RSS.

4. The propulsion engine of claim 2, wherein the first cooling aperture is disposed on the leading edge of the first RSS relative to a cooling fluid flow path through the gas turbine engine.

5. The propulsion engine of claim 1, wherein the first RSS is an airfoil or vane configured to modify a flow of the cooling fluid through the gas turbine engine placed in a location of an air flow velocity.

6. The propulsion engine of claim 1, wherein the first RSS is a strut configured to mechanically support a core component of the gas turbine engine placed in a location of an air flow velocity.

7. The propulsion engine of claim 1, further comprising:
    a second RSS radially disposed about the engine centerline,
    wherein the second RSS defines at least one cooling aperture fluidically coupling a cavity of the second RSS to an exterior surface of the second RSS, the cooling aperture configured to allow fluid to flow into or out of the cavity.

8. The propulsion engine of claim 7, wherein the second RSS is axially displaced from the first RSS along the engine centerline.

9. The propulsion engine of claim 7, wherein the second RSS is radially disposed about the engine centerline at a same location along an axial axis as the first RSS.

10. The propulsion engine of claim 1, where the at least one cooling aperture includes at least two inlet cooling apertures or at least two outlet cooling apertures.

11. The propulsion engine of claim 1, wherein the at least one cooling aperture defines a maximum dimension of from about 0.05 inches and about 1.0 inches.

12. The propulsion engine of claim 1, where the at least one cooling aperture defines a shape selected from the group consisting of a circle, an oval, an ellipse, or a slot.

13. The propulsion engine of claim 1, further comprising:
    a nacelle, wherein the nacelle defines a channel fluidically coupling an inlet cooling aperture formed in the nacelle with the cavity of the first RSS.

14. The propulsion engine of claim 1, wherein the power cable is a first power cable, and wherein a second power cable is at least partially disposed within the cavity of the first RSS.

15. The propulsion engine of claim 14, further comprising a spacer separating the first power cable and the second power cable, the separation between the first power cable and the second power cable defining a path for the fluid to flow around a cross-sectional perimeter of the first power cable and the second power cable.

16. The propulsion engine of claim 1, further comprising a sheltering element that provides protection for the at least one cooling aperture from contamination by debris.

17. The propulsion engine of claim 1, further comprising:
    a high power device, wherein the power cable transports electrical energy between the high power device and one or more other components of an aircraft, and wherein the high power device comprises one or more of: an electric generator, an electric motor, and an electric heater.

18. An aircraft comprising the propulsion engine of claim 1.

19. A method comprising:
    passing electrical current through a power cable at least partially contained within a cavity of a first radial support structure (RSS) or a cavity fluidically coupled to the cavity of the first RSS, wherein the first RSS is radially disposed about an engine centerline of a propulsion engine; and
    cooling the power cable by flowing cooling fluid through at least one cooling aperture defined by the first RSS, wherein the at least one cooling aperture fluidically couples the cavity of the first RSS to an exterior surface of the first RSS and is sized to both maintain a temperature of the power cable below a critical temperature during operation of the gas turbine engine and provide an electromagnetic interference (EMI) shield.

* * * * *